(12) United States Patent
Colosimo, Jr. et al.

(10) Patent No.: US 9,865,560 B2
(45) Date of Patent: *Jan. 9, 2018

(54) METHODS OF FORMING WIRE INTERCONNECT STRUCTURES

(71) Applicant: Kulicke and Soffa Industries, Inc., Fort Washington, PA (US)

(72) Inventors: Thomas J. Colosimo, Jr., West Chester, PA (US); Jon W. Brunner, Sellersville, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 26 days.

This patent is subject to a terminal disclaimer.

(21) Appl. No.: 15/298,406

(22) Filed: Oct. 20, 2016

(65) Prior Publication Data

US 2017/0040280 A1 Feb. 9, 2017

Related U.S. Application Data

(63) Continuation of application No. 14/413,475, filed as application No. PCT/US2013/048860 on Jul. 1, 2013, now Pat. No. 9,502,371.

(Continued)

(51) Int. Cl.
*H01L 21/00* (2006.01)
*H01L 23/00* (2006.01)

(52) U.S. Cl.
CPC .............. *H01L 24/43* (2013.01); *H01L 24/78* (2013.01); *H01L 24/85* (2013.01); *H01L 24/97* (2013.01);

(Continued)

(58) Field of Classification Search
CPC ......... H01L 24/43; H01L 24/78; H01L 24/97; H01L 24/85; H01L 2224/85203;

(Continued)

(56) References Cited

U.S. PATENT DOCUMENTS 4,213,556 A * 7/1980 Persson ................... H01L 24/78
228/104
4,860,433 A * 8/1989 Miura ................... H01F 27/292
228/110.1

(Continued)

FOREIGN PATENT DOCUMENTS

JP 09-289276 11/1997
JP 10-135220 5/1998

(Continued)

OTHER PUBLICATIONS

International Search Report for PCT/US2013/048860 dated by the Korean Intellectual Property Office on Sep. 27, 2013.

*Primary Examiner* — Vu A Vu

(74) *Attorney, Agent, or Firm* — Stradley Ronon Stevens & Young, LLP

(57) ABSTRACT

A method of forming a wire interconnect structure includes the steps of: (a) forming a wire bond at a bonding location on a substrate using a wire bonding tool; (b) extending a length of wire, continuous with the wire bond, to another location; (c) pressing a portion of the length of wire against the other location using the wire bonding tool; (d) moving the wire bonding tool, and the pressed portion of the length of wire, to a position above the wire bond; and (e) separating the length of wire from a wire supply at the pressed portion, thereby providing a wire interconnect structure bonded to the bonding location.

24 Claims, 5 Drawing Sheets

Related U.S. Application Data

(60) Provisional application No. 61/672,449, filed on Jul. 17, 2012.

(52) U.S. Cl.
CPC .. *H01L 2224/432* (2013.01); *H01L 2224/451* (2013.01); *H01L 2224/45139* (2013.01); *H01L 2224/4845* (2013.01); *H01L 2224/48091* (2013.01); *H01L 2224/48465* (2013.01); *H01L 2224/78301* (2013.01); *H01L 2224/78611* (2013.01); *H01L 2224/78621* (2013.01); *H01L 2224/851* (2013.01); *H01L 2224/85045* (2013.01); *H01L 2224/85181* (2013.01); *H01L 2224/85201* (2013.01); *H01L 2224/85203* (2013.01); *H01L 2224/85205* (2013.01); *H01L 2224/85207* (2013.01); *H01L 2224/85365* (2013.01); *H01L 2924/00011* (2013.01); *H01L 2924/00014* (2013.01)

(58) Field of Classification Search
CPC ....... H01L 2924/00014; H01L 224/451; H01L 2224/45139; H01L 2224/78621; H01L 2224/78611; H01L 2224/85201; H01L 2224/85365; H01L 2224/85205
USPC .............. 438/106; 228/180.05, 110.01, 101, 228/180.22
See application file for complete search history.

(56) References Cited

U.S. PATENT DOCUMENTS

| | | | | |
|---|---|---|---|---|
| 5,045,975 A | | 9/1991 | Cray et al. | |
| 5,172,851 A | * | 12/1992 | Matsushita | B23K 20/007 228/180.22 |
| 5,195,237 A | * | 3/1993 | Cray | H01L 24/11 257/E21.518 |
| 5,421,503 A | * | 6/1995 | Perlberg | H01L 24/78 228/180.5 |
| 5,989,995 A | * | 11/1999 | Nishiura | H01L 24/48 228/180.5 |
| 6,295,729 B1 | * | 10/2001 | Beaman | B23K 20/004 228/180.5 |
| 6,815,836 B2 | * | 11/2004 | Ano | H01L 24/48 257/686 |
| 6,836,962 B2 | * | 1/2005 | Khandros | B21D 39/00 29/842 |
| 6,894,387 B2 | * | 5/2005 | Higashi | H01L 24/11 257/737 |
| 7,032,311 B2 | * | 4/2006 | Razon | H01L 23/49811 257/E21.518 |
| 7,044,357 B2 | * | 5/2006 | Mii | B23K 20/004 228/180.22 |
| 7,225,538 B2 | * | 6/2007 | Eldridge | B23K 20/004 228/180.5 |
| 7,227,095 B2 | * | 6/2007 | Roberts | B23K 20/005 219/56.22 |
| 7,229,906 B2 | * | 6/2007 | Babinetz | H01L 24/11 257/E21.508 |
| 7,255,538 B2 | * | 8/2007 | Shi | F01D 5/026 403/29 |
| 7,621,436 B2 | | 11/2009 | Mii et al. | |
| 9,502,371 B2 | * | 11/2016 | Colosimo, Jr. | H01L 24/97 |
| 2006/0027623 A1 | * | 2/2006 | Yanagisawa | B23K 20/004 228/4.5 |
| 2006/0175383 A1 | | 8/2006 | Mii et al. | |
| 2007/0187467 A1 | * | 8/2007 | Toyama | H01L 24/11 228/101 |
| 2010/0090330 A1 | * | 4/2010 | Nakazato | H01L 23/4952 257/692 |

FOREIGN PATENT DOCUMENTS

| | | |
|---|---|---|
| JP | 2007-066991 | 3/2007 |
| JP | 2007134611 | 5/2007 |

* cited by examiner

METHODS OF FORMING WIRE INTERCONNECT STRUCTURES

CROSS-REFERENCE TO RELATED APPLICATIONS

This application is a continuation of U.S. patent application Ser. No. 14/413,475, filed Jan. 8, 2015, which claims the benefit of PCT Application No. PCT/US2013/048860, filed Jul. 1, 2013, which claims the benefit of U.S. Provisional Application No. 61/672,449, filed Jul. 17, 2012, the contents of which are incorporated herein by reference.

FIELD OF THE INVENTION

The present invention relates to semiconductor packaging, and more particularly, to improved methods of forming wire interconnect structures.

BACKGROUND OF THE INVENTION

A wire bonder (i.e., wire bonding machine) may form wire loops between respective locations to be electrically interconnected. Exemplary wire bonding techniques include ball bonding and wedge bonding. Steps in a ball bonding application include: bonding a free air ball to a first bond location (e.g., a die pad of a semiconductor die); extending a length of wire continuous with the bonded free air ball to a second bond location (e.g., a lead of a leadframe); and bonding the wire to the second bond location, thereby forming a wire loop between the first bond location and the second bond location. In forming the bonds between (a) the ends of the wire loop and (b) the bond sites (e.g., die pads, leads, etc.) varying types of bonding energy may be used including, for example, ultrasonic energy, thermosonic energy, thermo-compressive energy, amongst others.

Wire bonding machines have also been used to form wire contacts and interconnects having a free end for a number of years. For example, U.S. Pat. No. 5,476,211 to Khandros discloses forming such conductive contacts using ball bonding techniques. However, conventional techniques of forming such wire contacts and interconnects suffer from a lack of consistency (e.g., height consistency, shape consistency, etc.) and undesirable shapes of the wire contacts and interconnects.

Thus, it would be desirable to provide improved methods of forming wire interconnect structures.

SUMMARY OF THE INVENTION

According to an exemplary embodiment of the present invention, a method of forming a wire interconnect structure includes the steps of: (a) forming a wire bond at a bonding location on a substrate using a wire bonding tool; (b) extending a length of wire, continuous with the wire bond, to another location; (c) pressing a portion of the length of wire against the other location using the wire bonding tool; (d) moving the wire bonding tool, and the pressed portion of the length of wire, to a position above the wire bond; and (e) separating (e.g., stretching and tearing) the length of wire from a wire supply at the pressed portion, thereby providing a wire interconnect structure bonded to the bonding location.

According to another exemplary embodiment of the present invention, a method of forming a wire interconnect structure, the method comprising the steps of: (a) forming a ball bond at a bonding location on a substrate using a wire bonding tool; (b) extending a length of wire, continuous with the ball bond, to another location; (c) pressing a portion of the length of wire against the other location using the wire bonding tool to partially cut a portion of the length of wire; (d) moving the wire bonding tool, and the partially cut portion of the length of wire, to a position above the wire bond; (e) extending an additional length of wire from the wire bonding tool, and above the partially cut portion of the length of wire; and (f) separating the length of wire from a wire supply at the partially cut portion, thereby providing a wire interconnect structure bonded to the bonding location, the wire interconnect structure extending substantially vertical above the wire bond.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures.

DETAILED DESCRIPTION OF THE INVENTION

As used herein, the term "interconnect structures" or "wire interconnect structures" are intended to refer to conductive structures that may be used to provide any type of electrical interconnection (e.g., a temporary interconnection as in a contact used for testing, a permanent interconnection as in a semiconductor package interconnect, etc.).

Figure 1A:
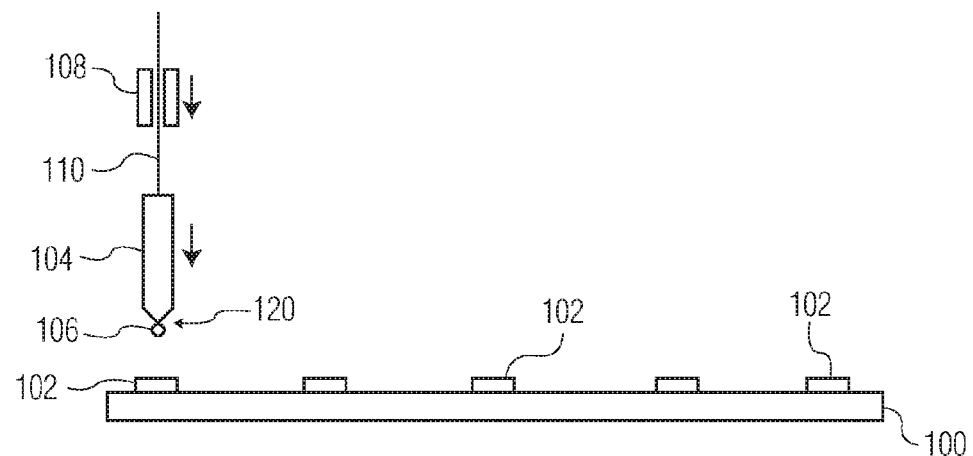
FIGS. 1A-1I are block, side view diagrams illustrating formation of vertical wire interconnects in accordance with an exemplary embodiment of the present invention.

FIGS. 1A-1I illustrate a method of forming one or more wire interconnect structures in accordance with an exemplary embodiment of the present invention. As illustrated in FIG. 1A, free air ball 106 is seated at the tip of bonding tool 104 (e.g., wire bonding tool 104) with wire 110 extending upwardly through a bore, or the like, in wire bonding tool 104 and through open wire clamp 108. Wire bonding tool 104 and wire clamp 108 are carried by a common bond head assembly (not shown) and as such, move together, for example, in a vertical Z axis. As will be understood by those skilled in the art, free air ball 106 is formed on an end of wire 110 that hangs below the tip of bonding tool 104 using an electronic flame-off device or the like (not shown). It will be understood that, many elements are omitted from the simplified views of FIGS. 1A-1I (e.g., an ultrasonic transducer carrying bonding tool 104, etc.).

After free air ball 106 is formed, wire 110 is drawn upwards (e.g., using a vacuum control tensioner or the like) such that free air ball 106 is seated at the tip of bonding tool 104 as shown in FIG. 1A. Wire bonding tool 104 and wire clamp 108 are positioned over substrate 100. As will be appreciated by those skilled in the art, substrate 100 may be any type of element to which a wire interconnect may be bonded. Exemplary substrates include leadframes, semiconductor die, BGA (ball grid array) package elements, flip chip elements, package-on-package (POP) elements, etc. Bonding location 102 may be any type structure configured to receive a wire interconnect. For example, if substrate 100 is a semiconductor die then bonding location 102 may be a die pad. Other exemplary bonding locations include leads, circuits traces, etc.

Figure 1B:
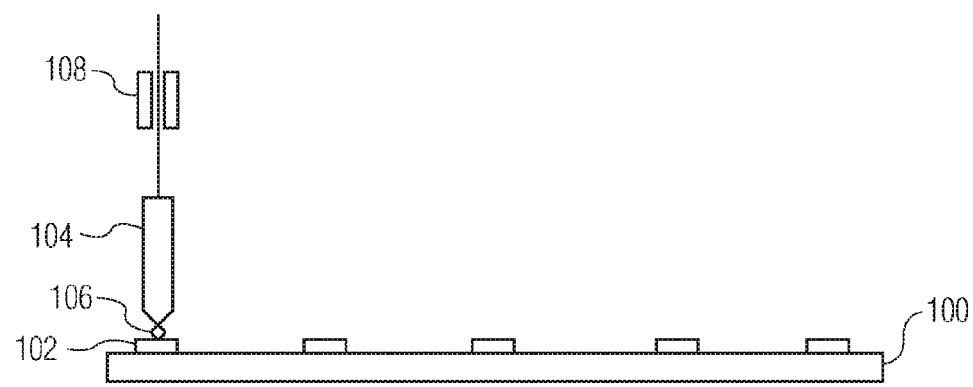
Figure 1C:
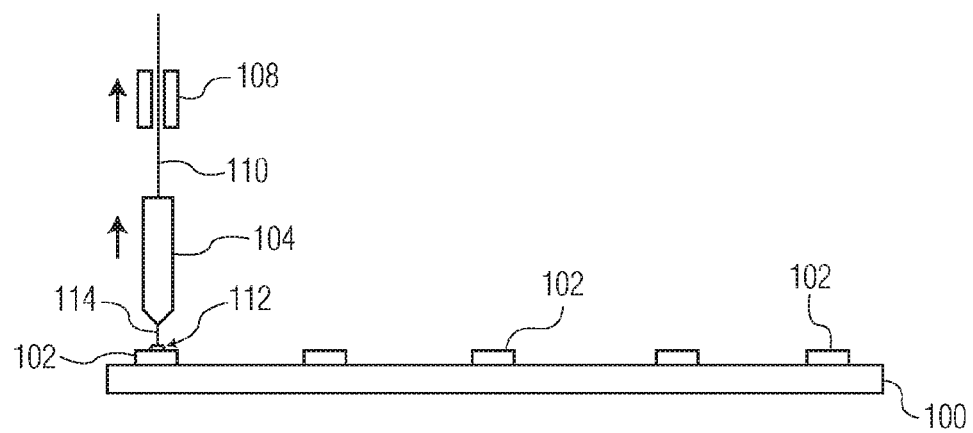
Figure 1D:
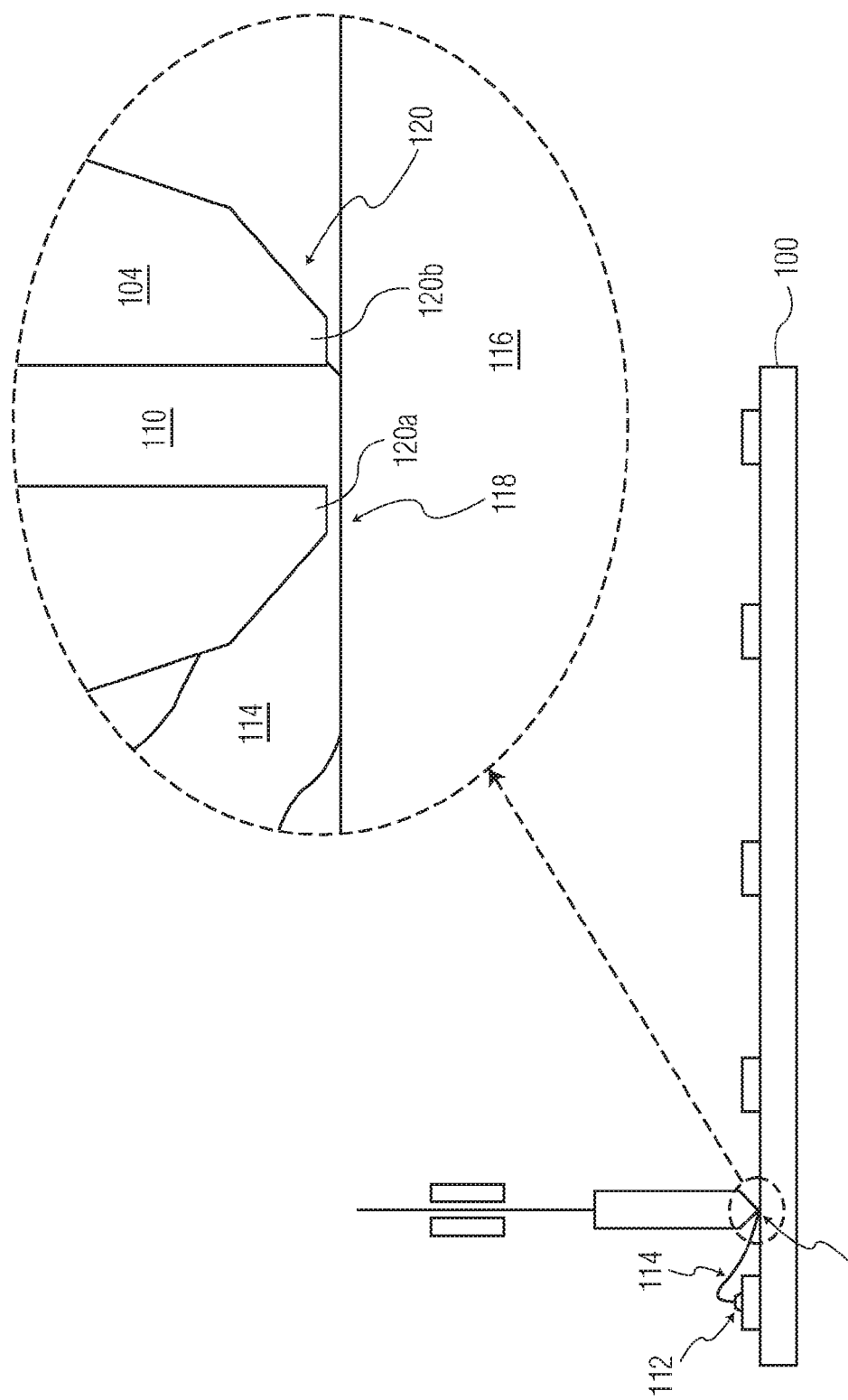

As shown in FIG. 1A, bonding tool 104 and wire clamp 108 are then moved downwardly, as at the arrows in a downward Z direction, towards bonding location 102 (e.g., along with other elements of the bond head assembly). As illustrated in FIG. 1B, bonding tool 104 and wire clamp 108 are lowered and free air ball 106 contacts bonding location 102 and will form a ball bond using, for example, bonding force, ultrasonic energy, and heat (e.g., a heat block positioned below substrate 100, not shown). As illustrated in FIGS. 1C-1D, ball bond 112 has now been formed, and bonding tool 104 and wire clamp 108 (in an open position) are moved upwardly while extending a length of wire 114 from ball bond 112 towards another location 116. Length of wire 114 is continuous with ball bond 112. Length of wire 114 may be extended in a single step, or a plurality of steps and associated motions, as desired. The motions used to extend length of wire 114 may be similar to conventional looping motions used to extend a wire loop from a first bond location to a second bond location; however, the portion of wire 114 adjacent tip 120 of bonding tool 104 is not ultrasonically bonded/welded to another location 116. Rather, a predetermined level of bond force (e.g., likely without ultrasonic energy), is applied to tip 120 of wire bonding tool 104 to press the portion of wire 114 against other location 116 (e.g., see FIG. 1D). In another example, rather than applying a predetermined amount of bonding force, wire bonding tool 104 is moved to a predetermined position such that a bond force is applied to press the portion of wire 114 against other location 116. Regardless of whether the bond force is applied in a force controlled mode, a position controlled mode, or other mode of operation—this pressing may "deform," or partially cut, pressed portion 118 of wire 114 beneath tip side 120a of bonding tool 104, for example, shown as deformed/cut wire portion 118. As provided above, deformed/cut wire portion 118 has not been bonded/welded to another location 116. Rather, it may be temporarily stuck to another location 116 during the formation of deformed/cut wire portion 118.

Figure 1E:
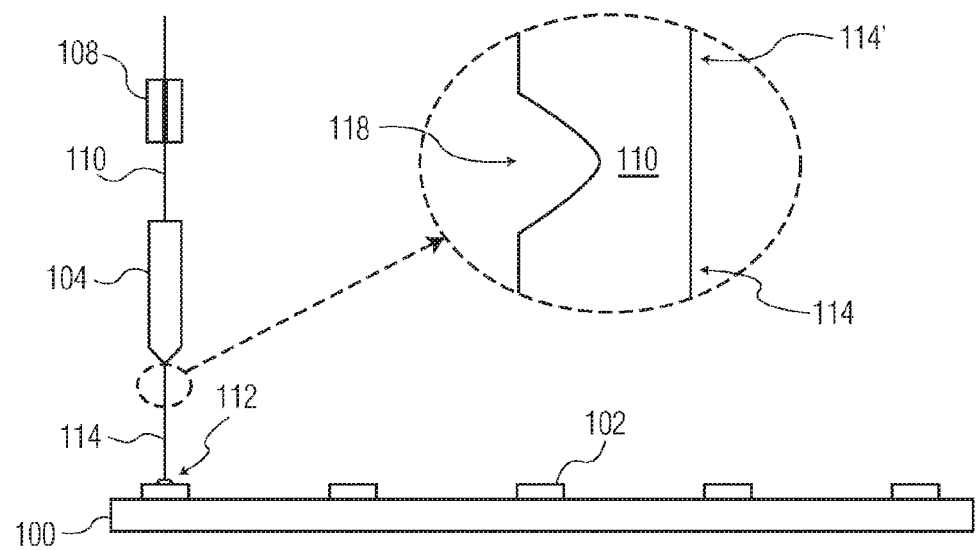

As illustrated in FIG. 1E, wire bonding tool 104 and wire clamp 108 (e.g., in a closed position, but may be open if desired) have been raised to a position above ball bond 112 with wire 110, having deformed/cut wire portion 118, continuous with ball bond 112. Such a position may be considered to be a top of loop (i.e., TOL) position in conventional wire looping terminology.

Figure 1F:
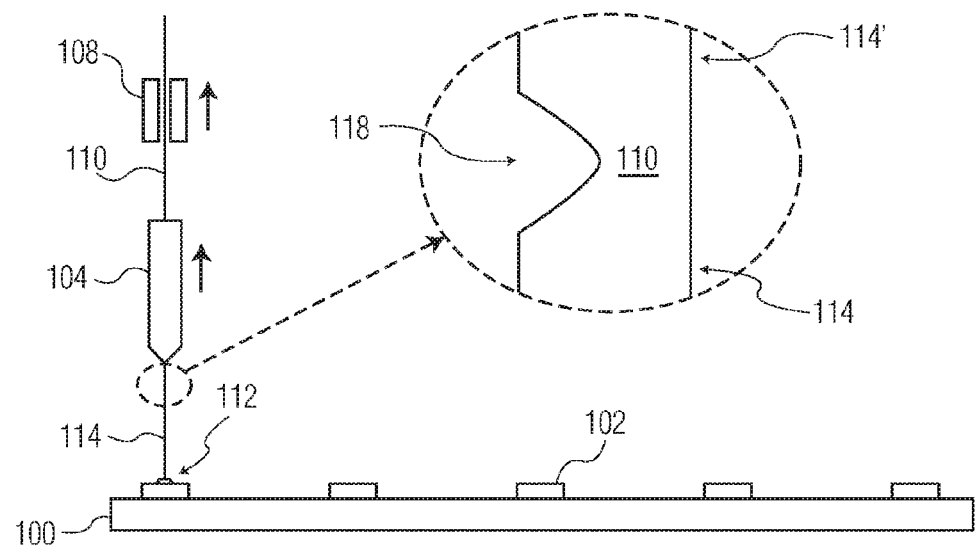
Figure 1G:
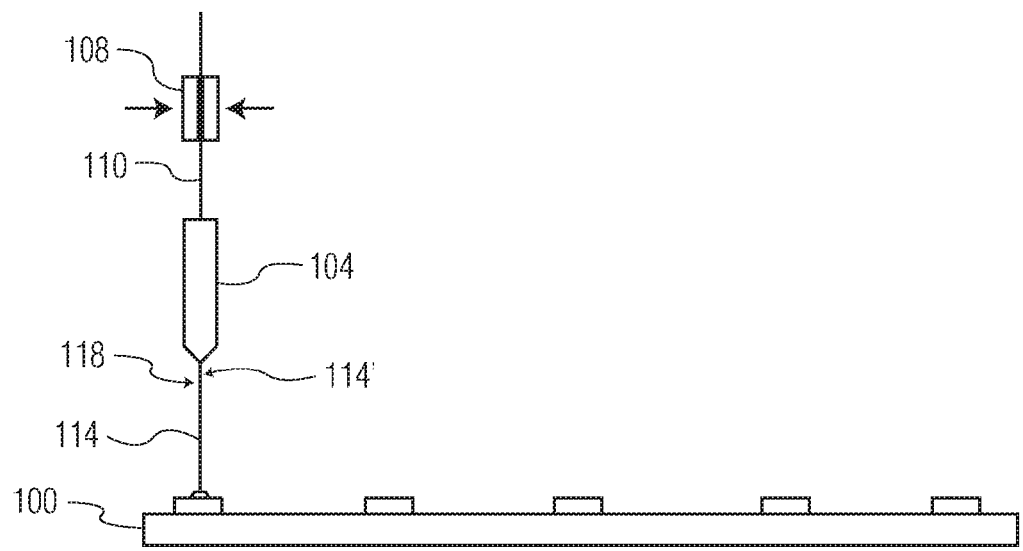
Figure 1H:
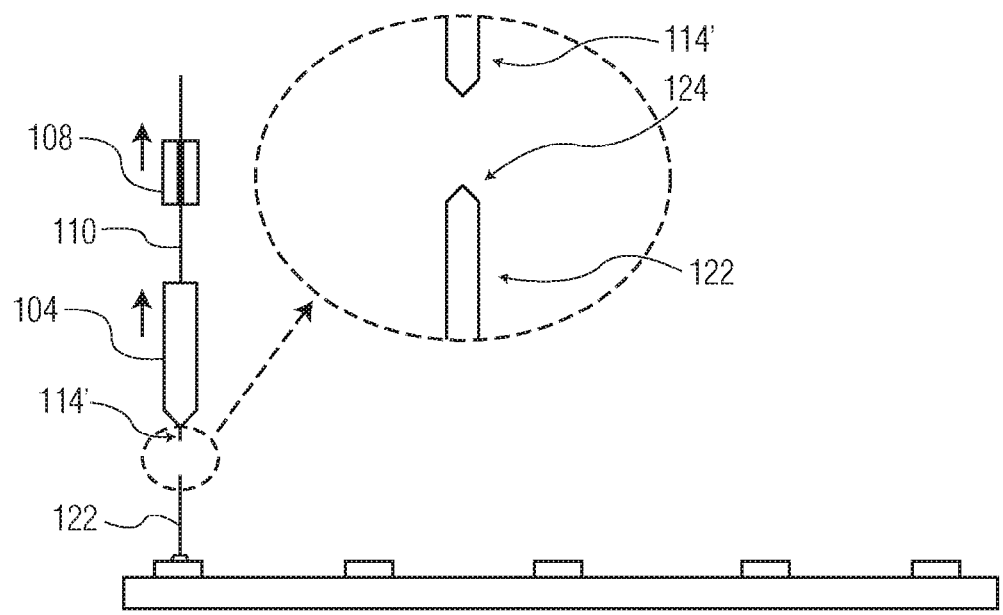
Figure 1I:
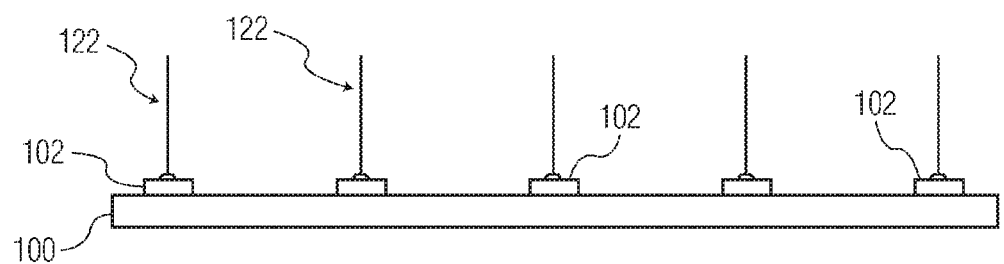

At FIG. 1F wire clamp 108 has been moved to an open position, and wire bonding tool 104 and open wire clamp 108 are being raised, as at the arrows in an upward Z direction, to pay out another portion of wire 114' (e.g., a tail length of wire 114') from wire bonding tool tip 120 that is continuous with deformed/cut wire portion 118. For example, wire portion 114' may become a wire tail for a subsequent free air ball. As more clearly shown in the enlarged portion of the circle below tip 120 of bonding tool 104 in FIGS. 1E-1F, pressed wire portion 118 of wire 110 may be a partial cut in wire 110, and separates wire portions 114, 114'. As illustrated in FIG. 1G, wire clamp 108 is closed over an upper portion of wire 110 and, as illustrated in FIG. 1H, wire bonding tool 104 and wire clamp 108 are then raised as at the arrows in an upward Z direction to separate wire 110 proximate deformed/cut wire portion 118 to form wire interconnect structure 122. The enlarged portion of the circle below the tip of wire bonding tool 104 more clearly shows that wire interconnect structure 122 (separated from wire portion 114') may have an upper tapered, or sharp, end 124. FIG. 1I illustrates substrate 100 with other wire interconnect structures 122 formed on additional bonding locations 102 by the repeating of the method described above. As illustrated, wire interconnect structures 122 may be vertically erect, or substantially so.

Figure 2:
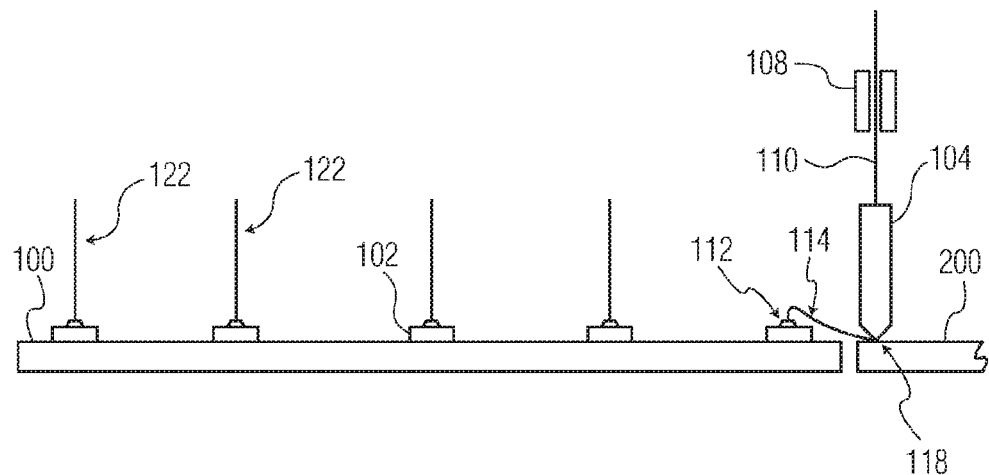
FIG. 2 is a block, side view diagram illustrating formation of vertical wire interconnects on a substrate in accordance with another exemplary embodiment of the present invention.

As described above in connection with FIG. 1D, a portion of wire 114 is pressed against another location 116. In the embodiment of FIGS. 1A-1H, another location 116 may be a portion of substrate 100 (e.g. a surface portion of substrate 100, etc.). However, it may be appreciated by those skilled in the art that any location may be used for another location 116. For example, as illustrated in FIG. 2, and according to another embodiment of the present invention, the pressing of wire portion 118 (for some, or all, of wire interconnect structures 122 to be formed on substrate 100) may occur at a location other than substrate 100 (e.g., on another substrate or structure), such as at another location/substrate 200 shown in FIG. 2 that is not (directly) part of substrate 100.

Wire interconnect structures formed in accordance with the present invention may have improved consistency in height and resultant wire tail lengths, as well as increased efficiency in production (e.g., an increase in unit per hour produced).

Wire interconnect structures formed in accordance with the present invention may be used, for example, as contact structures in probe cards, as interconnects between die in stacked die applications, as interconnects in flip chip applications, as interconnects in through silicon via or through mold via applications, as interconnects between packages in POP (package on package) applications, amongst others.

Although the present invention has been described primarily with respect to certain exemplary method steps in a predetermined order, it is not limited thereto. Certain of the steps may be rearranged or omitted, or additional steps may be added, within the scope of the present invention.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method of forming a wire interconnect structure, the method comprising the steps of:
    (a) forming a wire bond at a bonding location on a substrate using a wire bonding tool;
    (b) extending a length of wire, continuous with the wire bond, to another location;
    (c) pressing a portion of the continuous length of wire against the other location using the wire bonding tool;
    (d) moving the wire bonding tool, and the pressed portion of the length of wire, to a position above the wire bond; and
    (e) separating the continuous length of wire from a wire supply at the pressed portion, thereby providing a wire interconnect structure bonded to the bonding location, wherein the wire interconnect structure extends substantially vertical above the wire bond.

2. The method of claim 1 wherein the pressing step partially cuts the portion of the length of wire to form a partially cut portion of the continuous length of wire.

3. The method of claim 1 further comprising a step of forming a free air ball that is used to form the wire bond in step (a).

4. The method of claim 3 wherein a bonding force and ultrasonic energy are used in forming the wire bond.

5. The method of claim 1 wherein a bond force is used in the pressing step (c).

6. The method of claim 5 wherein ultrasonic energy is not used with the bond force in the pressing step (c).

7. The method of claim 1 further comprising the step of:
(d1) extending an additional length of wire from the bonding tool, and above the pressed portion of the continuous length of wire between steps (d) and (e).

8. The method of claim 7 further comprising the step of closing a wire clamp against an upper portion of wire after step (d1) and before step (e).

9. The method of claim 8 wherein the separating of step (e) includes raising the closed wire clamp and the wire bonding tool in separating the continuous length of wire from a wire supply at the pressed portion.

10. The method of claim 1 wherein steps (a)-(e) are repeated to form a plurality of wire interconnect structures.

11. The method of claim 1 further comprising the step of using the wire interconnect structure to electrically connect the substrate with another, adjacent substrate.

12. The method of claim 1 wherein the other location is on the substrate.

13. The method of claim 1 wherein the other location is not on the substrate.

14. The method of claim 1 further comprising the step of closing a wire clamp against an upper portion of wire after step (d) and before step (e).

15. A method of forming a wire interconnect structure, the method comprising the steps of:
(a) forming a ball bond at a bonding location on a substrate using a wire bonding tool;
(b) extending a length of wire, continuous with the ball bond, to another location;
(c) pressing a portion of the length of wire against the other location using the wire bonding tool to partially cut a portion of the length of wire;
(d) moving the wire bonding tool, and the partially cut portion of the length of wire, to a position above the ball bond;
(e) extending an additional length of wire from the wire bonding tool, and above the partially cut portion of the length of wire; and
(f) separating the length of wire from a wire supply at the partially cut portion, thereby providing a wire interconnect structure bonded to the bonding location, the wire interconnect structure extending substantially vertical above the ball bond.

16. The method of claim 15 further comprising a step of forming a free air ball that is used to form the ball bond in step (a).

17. The method of claim 15 wherein a bonding force and ultrasonic energy are used in forming the ball bond.

18. The method of claim 15 wherein a bond force is used in the pressing step (c).

19. The method of claim 18 wherein ultrasonic energy is not used with the bond force in the pressing step (c).

20. The method of claim 15 further comprising the step of closing a wire clamp against an upper portion of wire after step (e) and before step (f).

21. The method of claim 15 wherein steps (a)-(f) are repeated to form a plurality of wire interconnect structures.

22. The method of claim 15 further comprising the step of using the wire interconnect structure to electrically connect the substrate with another, adjacent substrate.

23. The method of claim 15 wherein the other location is on the substrate.

24. The method of claim 15 wherein the other location is not on the substrate.

* * * * *